US012047080B2

United States Patent
Huang

(10) Patent No.: US 12,047,080 B2
(45) Date of Patent: Jul. 23, 2024

(54) INPUT SAMPLING METHOD AND CIRCUIT, MEMORY AND ELECTRONIC DEVICE

(71) Applicant: CHANGXIN MEMORY TECHNOLOGIES, INC., Hefei (CN)

(72) Inventor: Zequn Huang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 247 days.

(21) Appl. No.: 17/657,580

(22) Filed: Mar. 31, 2022

(65) Prior Publication Data
US 2023/0010386 A1 Jan. 12, 2023

Related U.S. Application Data

(63) Continuation of application No. PCT/CN2021/112912, filed on Aug. 17, 2021.

(30) Foreign Application Priority Data

Jul. 7, 2021 (CN) .......................... 202110766084.X

(51) Int. Cl.
*H03K 5/02* (2006.01)
*H03K 5/05* (2006.01)
(Continued)

(52) U.S. Cl.
CPC ............. *H03K 5/023* (2013.01); *H03K 5/05* (2013.01); *H03K 5/06* (2013.01); *H03K 19/20* (2013.01)

(58) Field of Classification Search
CPC ............ H03K 5/023; H03K 5/05; H03K 5/06; H03K 19/20; H03K 5/135; H03K 5/1565;
(Continued)

(56) References Cited

U.S. PATENT DOCUMENTS 8,686,884 B2* 4/2014 Baumgartner ........ H03M 1/109
341/145
8,837,639 B2* 9/2014 Cordos ................. H04L 7/0338
375/322
(Continued)

FOREIGN PATENT DOCUMENTS

CN 1737896 A 2/2006
CN 100397529 C 6/2008
(Continued)

OTHER PUBLICATIONS

Semiconductor Integrated Circuit—JP 2006332945 A (English Translation)—Tanaka Nobuyuki (Year: 2006).*
(Continued)

*Primary Examiner* — Vibol Tan
(74) *Attorney, Agent, or Firm* — SYNCODA LLC; Feng Ma

(57) ABSTRACT

An input sampling method includes the following: acquiring a first pulse signal and a second pulse signal respectively; widening a pulse width of the first pulse signal to obtain a widened first pulse signal; shielding an invalid signal in the second pulse signal based on the widened first pulse signal to obtain a to-be-sampled signal; and finally, sampling the to-be-sampled signal based on a clock signal. In this way, prior to signal sampling, the invalid signal is shielded to avoid additional power consumption caused by sampling the invalid signal, and at the same time, the pulse width of the signal is widened to avoid sampling failure.

18 Claims, 15 Drawing Sheets

(51) Int. Cl.
*H03K 5/06* (2006.01)
*H03K 19/20* (2006.01)

(58) Field of Classification Search
CPC .... H03K 19/003; H03K 21/026; H03K 23/58; H03K 5/1534; G11C 7/109; G11C 7/222; G11C 11/4093; G11C 7/02; G11C 27/02; G11C 7/225; G11C 11/4082; G11C 29/4401; G11C 7/24; G11C 7/106; G11C 7/1057

See application file for complete search history.

(56) References Cited

U.S. PATENT DOCUMENTS

| | | | |
|---|---|---|---|
| 9,070,430 | B2 | 6/2015 | Lin |
| 9,389,953 | B2 | 7/2016 | Choi |
| 9,705,507 | B1 * | 7/2017 | Jain ...................... H03K 21/026 |
| 10,879,914 | B1 | 12/2020 | Jung |
| 2005/0134342 | A1 | 6/2005 | Lin |
| 2006/0039214 | A1 | 2/2006 | Yamasaki |
| 2007/0101177 | A1 | 5/2007 | Kuroki |
| 2012/0327736 | A1 | 12/2012 | Lin |
| 2013/0076396 | A1 | 3/2013 | Rao |
| 2015/0055695 | A1 | 2/2015 | Huang |
| 2019/0361820 | A1 | 11/2019 | Ware |
| 2021/0021273 | A1 | 1/2021 | Jung |

FOREIGN PATENT DOCUMENTS

| | | | | |
|---|---|---|---|---|
| CN | 101692346 A | | 4/2010 | |
| CN | 102347813 A | | 2/2012 | |
| CN | 106019350 A | | 10/2016 | |
| CN | 106055496 A | | 10/2016 | |
| CN | 107807890 A | | 3/2018 | |
| CN | 108429456 A | * | 8/2018 | ............ H02M 3/157 |
| CN | 109905103 A | | 6/2019 | |
| CN | 112242842 A | | 1/2021 | |
| JP | 2006332945 A | * | 12/2006 | ........... H03K 5/1252 |
| JP | 2014154910 A | * | 8/2014 | |

OTHER PUBLICATIONS

International Search Report in the international application No. PCT/CN2021/112912, mailed on Apr. 6, 2022. 5 pages with English translation.

International Search Report in the international application No. PCT/CN2021/112921, mailed on Mar. 29, 2022. 6 pages with English translation.

Non-Final Office Action of the U.S. Appl. No. 17/651,421, issued on Nov. 17, 2023. 33 pages.

* cited by examiner

INPUT SAMPLING METHOD AND CIRCUIT, MEMORY AND ELECTRONIC DEVICE

CROSS-REFERENCE TO RELATED APPLICATIONS

This is a continuation of International Patent Application No. PCT/CN2021/112912 filed on Aug. 17, 2021, which claims priority to Chinese Patent Application No. 202110766084.X filed on Jul. 7, 2021. The disclosures of the above-referenced applications are hereby incorporated by reference in their entirety.

BACKGROUND

With the development of electronic technology, a Dynamic Random Access Memory (DRAM) has been widely applied in various electronic systems. Since a data bus of a Command/Address (C/A) signal in DRAM Dual Inline Memory Module (DIMM) design is shared by a plurality of DRAMs, that is, the C/A signals of a plurality of DRAMs share a data bus, each DRAM may receive invalid C/A signals belonging to other DRAMs. Therefore, the DRAM needs to determine whether the received C/A signal is valid according to a Chip Select (CS) signal.

SUMMARY

Embodiments of the present application relate to, but not limited to an input sampling method and circuit, a memory and an electronic device.

According to the embodiment of the present application, there is provided an input sampling method. The input sampling method includes:

acquiring a first pulse signal and a second pulse signal respectively;

widening a pulse width of the first pulse signal to obtain a widened first pulse signal;

shielding an invalid signal in the second pulse signal based on the widened first pulse signal to obtain a to-be-sampled signal; and sampling the to-be-sampled signal based on a clock signal.

According to the embodiment of the present application, there is also provided an input sampling circuit. The input sampling circuit includes an acquiring subcircuit, a widening subcircuit, a shielding subcircuit, and a sampling subcircuit.

A first output end of the acquiring subcircuit is connected to an input end of the widening subcircuit.

A second output end of the acquiring subcircuit and an output end of the widening subcircuit are respectively connected to a first input end and a second input end of the shielding subcircuit.

An output end of the shielding subcircuit is connected to a data input end of the sampling subcircuit.

A clock signal is inputted to a control input end of the sampling subcircuit.

The acquiring subcircuit is configured to acquire a first pulse signal and a second pulse signal respectively.

The widening subcircuit is configured to widen a pulse width of the first pulse signal to obtain a widened first pulse signal.

The shielding subcircuit is configured to shield an invalid signal in the second pulse signal based on the widened first pulse signal to obtain a to-be-sampled signal.

The sampling subcircuit is configured to sample the to-be-sampled signal based on the clock signal.

According to the embodiment of the present application, there is also provided a memory, including at least the foregoing input sampling circuit.

According to the embodiment of the present application, there is also provided an electronic device, including at least the foregoing memory.

DETAILED DESCRIPTION

Figure 1:
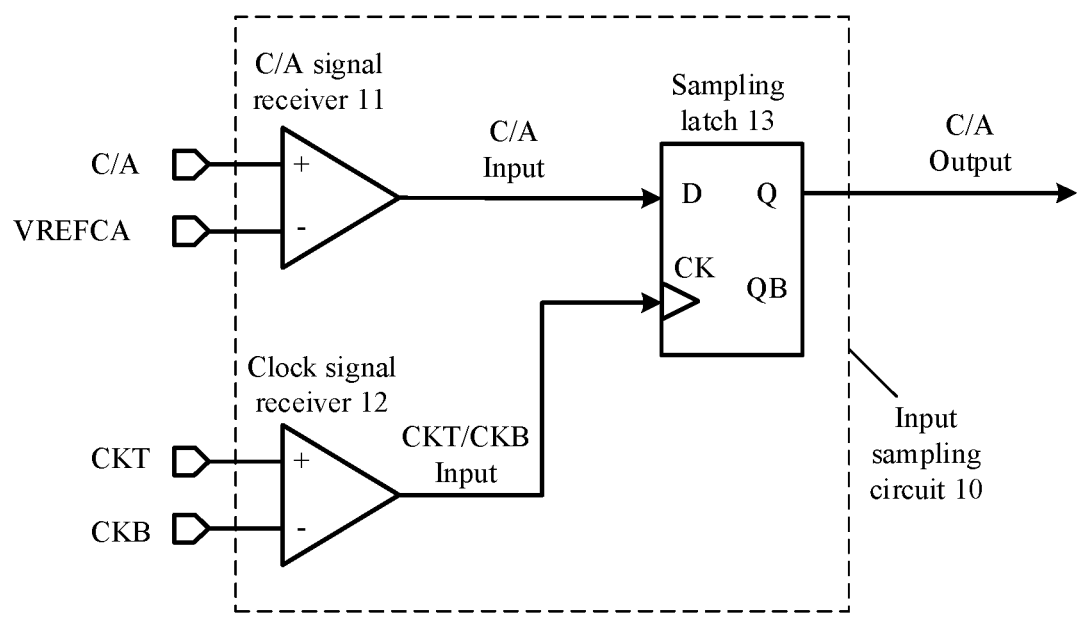
FIG. 1 is a schematic structural diagram of an input sampling circuit provided in the related technical solution.

Explanations of some terms appearing in the embodiments of the present application are as follows.

Dynamic Random Access Memory (DRAM): a semiconductor memory chip, often used in an internal memory, is a volatile memory. That is, the stored information will be lost after power failure. The working principle of the DRAM is to use the amount of charges stored in a capacitor to represent whether a binary bit is 1 or 0.

Double Data Rate-Dynamic Random Access Memory (DDR-DRAM): a DRAM that transmits data twice within one clock cycle. The DDR-DRAM can transmit data once in a rising period of a clock and transmit data once in a falling period of a clock. Therefore, a higher data transfer rate can be achieved under the same bus frequency.

Dual Inline Memory Module (DRAM DIMM): a memory module with dual sockets, each socket transmits signals independently. Therefore, the transmission needs of more data signals can be satisfied.

Chip select signal: a signal used when a certain integrated circuit chip is selected. When a plurality of chips share the same bus, the chip select signal is used for determining which chip the data and address signals on the bus are transmitted to.

C/A signal: a Command/Address signal, i.e., a control signal or an address signal. The control signal is used for controlling a computer signal. The address signal includes the read or written address information.

VREFCA signal: a reference voltage signal used for receiving the control and address signals. The VREFCA signal can effectively improve the signal-to-noise level of a system data bus.

Clock signal: a fixed-period square wave signal generated by the upper-level clock generator. The clock signal is the reference basis of a sequential logic in a digital circuit and is used for determining when to update the state in the logical unit.

Sampling: the process of measuring sample values of an input signal and replacing amplitudes of an original input signal within a certain period of time with the sample values.

Latch: a logical element with a memory function in the digital circuit, which is a memory unit circuit sensitive to pulse level. The latch can change state under the action of specific input pulse level, use the level to control the input of the data, and save the state of the input to the output.

The technical solutions in the embodiments of the present application will be clearly and completely described below in conjunction with the drawings in the embodiments of the present application.

In some implementations, a DRAM samples all the received C/A signals. In this way, invalid C/A signals are also sampled, which brings unnecessary energy consumption. Moreover, the operating frequency of the DRAM is constantly improved, and pulse widths of the C/A signal and the CS signal are constantly narrowed, which may cause signal sampling failure. Various embodiments of the present disclosure can address such problems.

In the current C/A input sampling system of the DRAM, the C/A signal and the clock signal enter the input sampling circuit through respective receivers, and then the C/A signal is sampled based on the clock signal. Then, the sampled C/A signal is outputted for subsequent logical operations.

FIG. 1 is a schematic structural diagram of an input sampling circuit in the current C/A input sampling system of the DRAM. As illustrated in FIG. 1, the input sampling circuit 10 includes: a C/A signal receiver 11, a clock signal receiver 12, and a sampling latch (i.e., C/A Latch) 13.

The C/A signal enters the input sampling circuit 10 through the C/A signal receiver 11. After receiving the C/A signal, the C/A signal receiver 11 outputs a synchronized C/A Input signal to a data input end (i.e., a D input end) of the sampling latch 13. The clock signal CKT/CKB enters the input sampling circuit through the clock signal receiver 12. After receiving the clock signal, the clock signal receiver 12 outputs a synchronized CKT/CKB Input signal to a control input end (i.e., a CK input end) of the sampling latch 13. The sampling latch 13 samples the C/A Input signal based on the CKT/CKB Input signal, and then outputs the sampled C/A Output signal.

However, since the C/A data bus is shared by a plurality of DRAMs in the DRAM DIMM design, the DRAM needs to determine whether the received C/A signal is valid according to the chip select signal. In the current C/A input sampling system, the DRAM samples all received C/A signals. In this way, invalid C/A signals are also sampled, which causes unnecessary power consumption.

Figure 2:
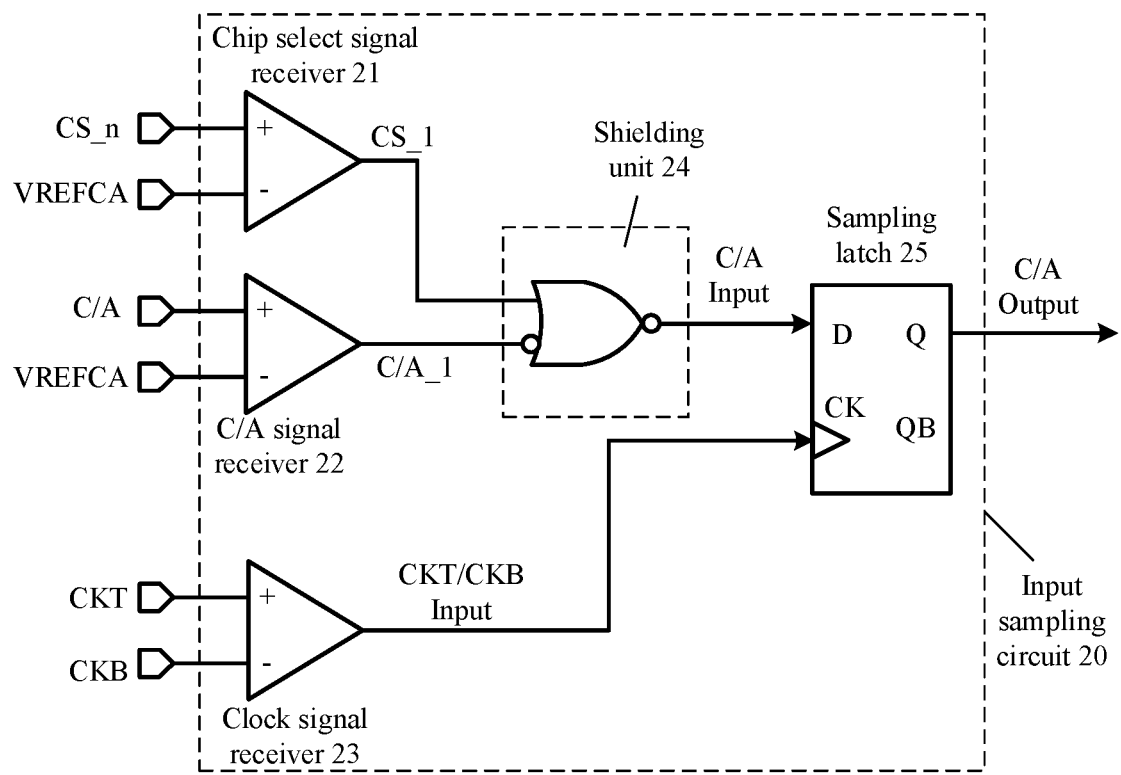
FIG. 2 is a schematic structural diagram I of an input sampling circuit provided by an embodiment of the present application.

The input sampling circuit 20 in FIG. 2 is added with a shielding subcircuit 24 based on the circuit in FIG. 1. As illustrated in FIG. 2, the input sampling circuit 20 includes: a chip select signal receiver 21, a C/A signal receiver 22, a clock signal receiver 23, a shielding subcircuit 24 and a sampling latch (i.e., C/A Latch) 25.

The C/A signal enters the input sampling circuit through the C/A signal receiver 22. After receiving the C/A signal, the C/A signal receiver 22 outputs a synchronized C/A_1 signal to a second input end of the shielding subcircuit 24. A CS_n signal (i.e., the chip select signal) enters the input sampling circuit through the chip select signal receiver 21. After receiving the chip select signal, the chip select signal receiver 21 outputs a synchronized CS_1 signal to a first input end of the shielding subcircuit 24.

The shielding subcircuit 24 performs logical operations on the received C/A_1 signal and CS_1 signal, as shown by the logical operation expression (1):

$$C/A\ \text{Input} = \overline{CS\_1 + \overline{C/A\_1}} \tag{1}$$

In the expression (1), CS_1 represents a logical operation value of the CS_1 signal, C/A_1 represents a logical operation value of the C/A_1 signal, C/A Input represents a logical operation value of the C/A Input signal outputted by the shielding subcircuit 24, "+" represents a logical OR operation, and "—" represents a logical NOT operation.

Then, the shielding subcircuit 24 outputs the C/A Input signal to a data input end (i.e., the D input end) of the sampling latch 25. The clock signal CKT/CKB enters the input sampling circuit 20 through the clock signal receiver 23. After receiving the clock signal CKT/CKB, the clock signal receiver 23 outputs a synchronized CKT/CKB Input signal to the control input end (i.e., the CK input end) of the sampling latch 25. The sampling latch 25 samples the C/A Input signal based on the CKT/CKB Input signal, and then outputs the sampled C/A Output signal.

In implementation, since the shielding subcircuit 24 is added to the input sampling circuit 20, when the DRAM does not receive the chip select signal (that is, the CS_n signal is 1), the shielding subcircuit 24 may shield the C/A signal, so that C/A Input signal has a constant value of 0. In this way, when the chip select signal is not received, even if there is a C/A signal input outside the input sampling circuit 20, there is no data flipping inside the input sampling circuit 20, thereby saving power consumption.

It should be noted that, since the chip select signal is generally active in a low-level state, the chip select signal is always kept at 1, and when the chip select signal changes to 0, it is a valid trigger signal. That is, when no chip select signal is received, the CS_n signal is 1. The C/A signal contains two signals with the same amplitude and opposite phases. When data flipping occurs on the two signals, it is a valid trigger signal.

Figure 3A:
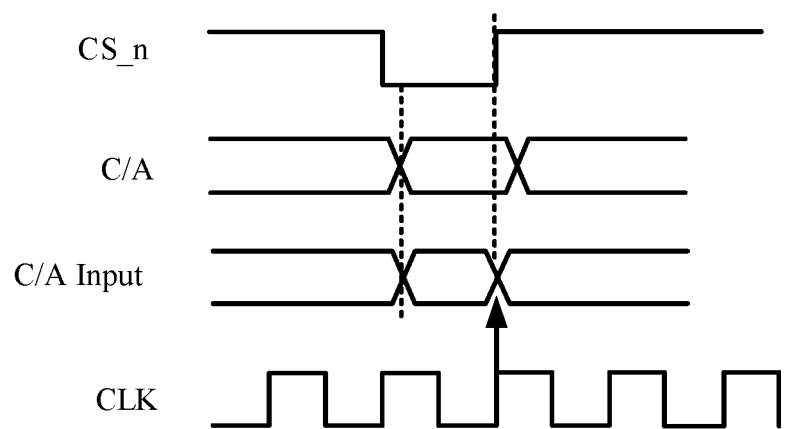
FIG. 3A is a schematic effect diagram I of an input sampling circuit provided by an embodiment of the present application.
Figure 3B:
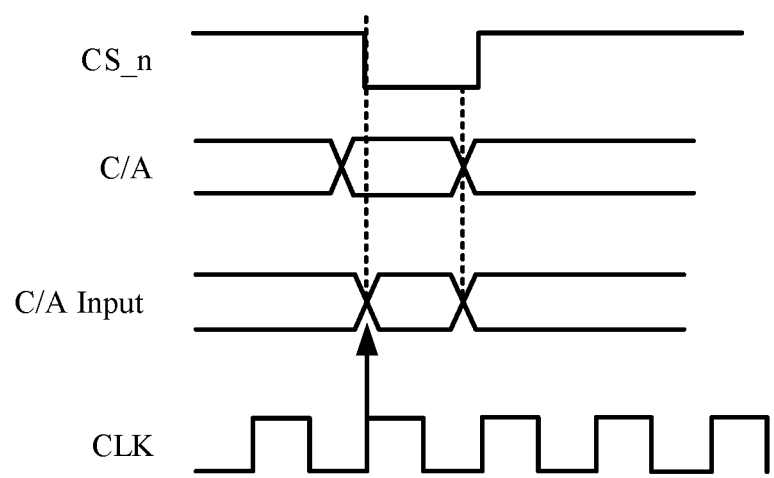
FIG. 3B is a schematic effect diagram II of an input sampling circuit provided by an embodiment of the present application.

However, the operating frequency of DRAM is constantly increased, and the pulse widths of the C/A signal and the chip select signal (i.e., the CS_n signal) are constantly narrowed. In the input sampling circuit 20 illustrated in FIG. 2 above, due to different paths taken by the C/A signal and the CS_n signal, the C/A signal may be advanced or delayed relative to the CS_n signal. Therefore, the C/A signal and the CS_n signal may skew, which causes sampling failure of the C/A signal. For the Hold time violation illustrated in FIG. 3A, if the hold time is not enough, the data may have been flipped when being sampled, thus the sampled data may be inaccurate. For the Setup time violation illustrated in FIG. 3B, if the signal is not established successfully yet when being sampled, the sampling failure of the C/A signal may still occur.

In this way, under the influence of skewing and the influence of Process, Voltage, Temperature (PVT) Variation, the pulse width of the C/A Input signal outputted by the shielding subcircuit will be narrowed, which may invalidate C/A sampling. Therefore, how to widen the pulse width of the signal is the problem needs to be solved.

Figure 4:
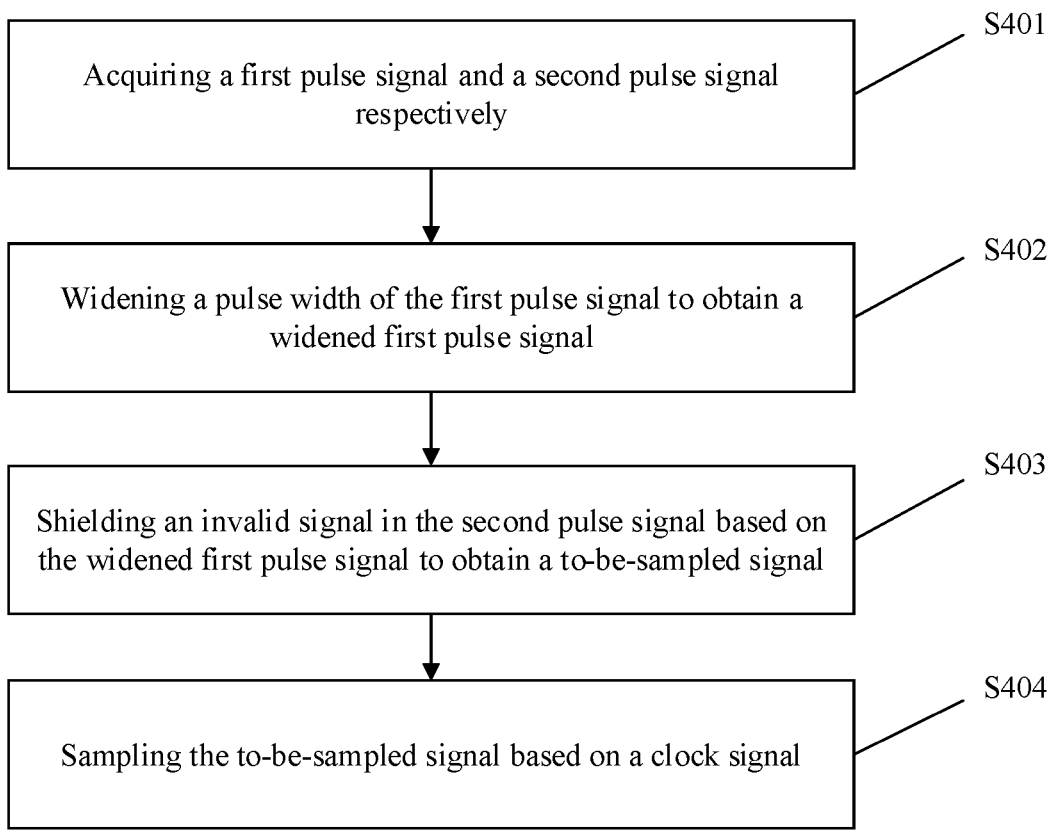
FIG. 4 is a flowchart I of an input sampling method provided by an embodiment of the present application.

FIG. 4 is an optional flowchart of an input sampling method provided by an embodiment of the present application, which may be described in conjunction with operations illustrated in FIG. 4.

At S401, a first pulse signal and a second pulse signal are respectively acquired.

In the embodiment of the present application, the acquiring subcircuit in the input sampling circuit respectively obtains the first pulse signal and the second pulse signal sent by the upper-level processing subcircuit.

The first pulse signal may be a chip select signal. The second pulse signal may be a C/A signal, i.e., a control signal or an address signal. The chip select signal is generally active in a low-level state, that is, when the chip select signal receiver receives a 0 signal, it means that the chip select signal is acquired. The C/A signal contains two signals with the same amplitude and opposite phases, which are transmitted discretely in the form of pulse signals. When the C/A signal receiver receives the flipping of the C/A signal, it means that a valid C/A signal is acquired.

It should be noted that, in the DRAM DIMM design, the C/A data bus is shared by a plurality of DRAMs. Therefore, the C/A signal acquired by the current DRAM may belong to other DRAM signals. In this case, the C/A signal is an invalid signal for the current DRAM. However, whether the C/A signal is an invalid signal or a valid signal is determined based on the chip select signal, that is, the C/A signal is controlled by the chip select signal. If the chip select signal is acquired by the current DRAM while the C/A signal is acquired, the C/A signal is a valid signal.

At S402, a pulse width of the first pulse signal is widened to obtain a widened first pulse signal.

In the embodiment of the present application, the widening subcircuit in the input sampling circuit widens the pulse width of the first pulse signal to obtain the widened first pulse signal. The pulse width refers to the duration of the pulse reaching the valid value, and widening the pulse signal is to extend the duration of the pulse valid value.

Figure 5A:
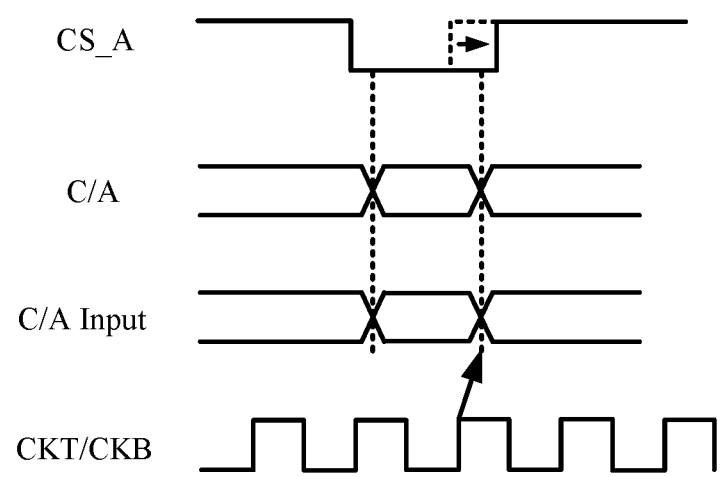
FIG. 5A is a schematic effect diagram III of an input sampling circuit provided by an embodiment of the present application.
Figure 5B:
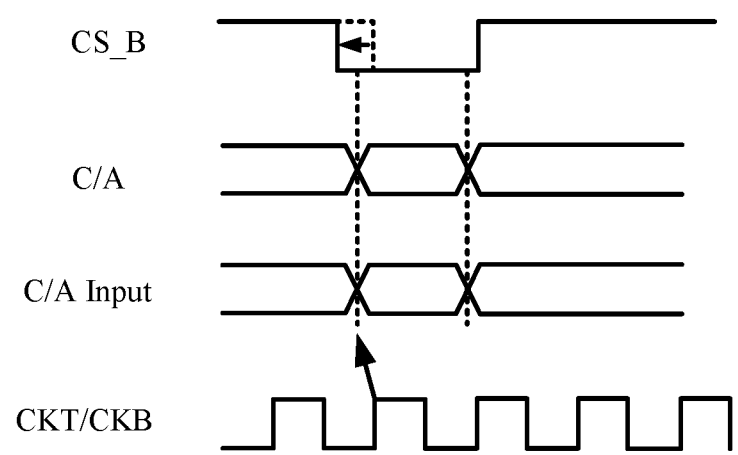
FIG. 5B is a schematic effect diagram IV of an input sampling circuit provided by an embodiment of the present application.

In the embodiment of the present application, when the first pulse signal needs to be widened is a chip select signal, since the chip select signal is active in a low-level state, widening the pulse width requires pushing (delaying) of a rising edge of the chip select signal, as illustrated by the CS_A signal in FIG. 5A, and/or pull-in (advancing) of a falling edge of the chip select signal, as illustrated by the CS_B signal in FIG. 5B. In this way, the widened chip select signal is obtained.

Figure 6:
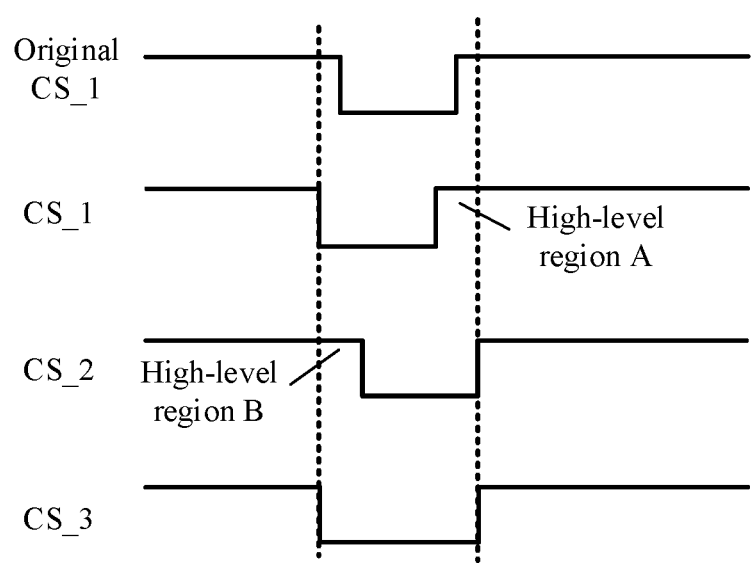
FIG. 6 is a schematic effect diagram V of an input sampling circuit provided by an embodiment of the present application.

FIG. 6 is a schematic diagram of a process of widening a chip select signal in an embodiment of the present application. The widening process in the embodiment of the present application may be described with reference to FIG. 6.

In the embodiment of the present application, the widening subcircuit may pass the first pulse signal through the delay subcircuit, thereby delaying the first pulse signal to obtain the delayed first pulse signal. For example, the CS_2 signal in FIG. 6 is a delayed signal of the original CS_1 signal. Moreover, the input sampling circuit can reduce the absolute delay of a first receiver for receiving the first pulse signal, or trigger an upper-level processing subcircuit of the first receiver to send the first pulse signal to the first receiver in advance, so as to obtain the advanced first pulse signal. For example, the CS_1 signal in FIG. 6 is an advanced signal of the original CS_1 signal.

Then, the widening subcircuit may generate the widened first pulse signal based on any two of the first pulse signal, the advanced first pulse signal, and the delayed first pulse signal. That is, the widening subcircuit may perform a first logical operation on the first pulse signal and the delayed first pulse signal, or perform the first logical operation on the advanced first pulse signal and the first pulse signal, or perform the first logical operation on the advanced first pulse signal and the delayed first pulse signal. In this way, the widened first pulse signal is obtained. For example, the CS_3 signal in FIG. 6 is a widened signal obtained after the first logical operation of the CS_1 signal and the CS_2 signal.

It should be noted that, the specific form of the first logical operation is related to the type of the first pulse signal. When the first pulse signal is a chip select signal, since the chip select signal is active in a low-level state, the first logical operation is a logical AND operation. Taking FIG. 6 as an example, the logical AND operation is performed on the CS_1 signal and the CS_2 signal in FIG. 6 to obtain the CS_3 signal. the CS_1 signal in the high-level region A is a 1 signal, and after a logical AND operation is performed on the 1 signal in the high-level region A and the 0 signal in a corresponding region in the CS_1 signal, the 0 signal in the corresponding region in the CS_3 signal is obtained. Similarly, after the logical AND operation is performed on a 1 signal in the high-level region B in the CS_2 signal, the 0 signal of the corresponding region in the CS_3 signal is obtained. In this way, a falling edge of the CS_3 signal is aligned with a falling edge of the CS_1 signal, and a rising edge of the CS_3 signal is aligned with a rising edge of the CS_2 signal. The CS_3 signal has a wider pulse width relative to the CS_1 signal or the CS_2 signal, thus completing the widening of the pulse width of the chip select signal.

However, if the first pulse signal is another type of signal, the first logical operation needs to be adjusted and changed accordingly. For example, when the first pulse signal is active in a high-level state, the first logical operation needs to be adjusted to a logical OR operation accordingly, which is not limited here.

It can be understood that, by widening the pulse width of the chip select signal, it can be still ensured that the pulse width of the chip select signal can cover the pulse width of the C/A signal in the case of skew between the chip select signal and the C/A signal. In this way, the problem of narrowing the pulse width in the subsequent processing can be avoided, so that there is no risk of error in input sampling.

At S403, an invalid signal in the second pulse signal is shielded based on the widened first pulse signal to obtain a to-be-sampled signal.

In the embodiment of the present application, the shielding subcircuit in the input sampling circuit may shield an invalid signal in the second pulse signal based on the widened first pulse signal to obtain a to-be-sampled signal.

In the embodiment of the present application, the shielding subcircuit may perform a second logical operation on the second pulse signal to obtain an intermediate signal of the second pulse signal. Then the shielding subcircuit may perform a third logical operation on the widened first pulse signal and the intermediate signal of the second pulse signal. In this way, shielding an invalid signal in the second pulse signal is completed, and a to-be-sampled signal is obtained.

It should be noted that, the specific forms of the second logical operation and the third logical operation are related to the types of the first pulse signal and the second pulse signal. When the first pulse signal and the second pulse signal are respectively a chip select signal and a C/A signal, since the chip select signal is active in a low-level state, the second logical operation is a logical NOT operation, and the third logical operation is a logical NOR operation. That is, the to-be-sampled signal, the widened first pulse signal, and the second pulse signal satisfy the following logical operation expression (2):

$$C/A \text{ Input} = \overline{CS\_3 + \overline{C/A}} \qquad (2)$$

In the expression (2), C/A Input represents a logical operation value of the to-be-sampled signal, CS_3 represents a logical operation value of the widened first pulse signal, C/A represents a logical operation value of the second pulse signal, "+" represents a logical OR operation, "—" represents a logical NOT operation.

In this way, when no chip select signal is acquired, that is, when CS_3 is 1, the value of C/A Input is always 0 regardless of the value of C/A. Hence, the invalid signal in the C/A signal is shielded based on the chip select signal.

However, if the first pulse signal and the second pulse signal are other types of signals, the second logical operation and the third logical operation need to be adjusted and changed accordingly. For example, when the first pulse signal is active in a high-level state, the third logical operation needs to be adjusted to a logical AND operation accordingly, which is not limited here.

It should be noted that, the pulse width of the to-be-sampled signal is related to the pulse widths of the widened first pulse signal and the second pulse signal. When the first pulse signal and the second pulse signal are respectively the chip select signal and the C/A signal, and the above logical operation expression (2) is satisfied, the pulse width of the to-be-sampled signal is the part where the pulse widths of the chip select signal and the C/A signal coincide. Therefore, when the pulse width of the chip select signal is widened enough to cover the pulse width of the C/A signal, the to-be-sampled signal outputted by the shielding subcircuit can maintain the same pulse width as the C/A signal. The C/A Input signal in FIG. 5A and FIG. 5B can maintain the same pulse width as the C/A signal. In this way, there is no risk of error in subsequent input sampling.

It can be understood that if the C/A signal directly enters the sampling subcircuit, the sampling subcircuit may also sample the invalid signal in the C/A signal, which causes unnecessary power consumption. Therefore, the shielding subcircuit shields the invalid signal in the C/A signal before the C/A signal enters the sampling subcircuit, which can prevent the invalid signal from being sampled, thereby saving power consumption.

At S404, the to-be-sampled signal is sampled based on a clock signal.

In the embodiment of the present application, the sampling subcircuit in the input sampling circuit may receive the to-be-sampled signal and the clock signal respectively, and then sample to-be-sampled signal based on the clock signal.

In the embodiment of the present application, the sampling subcircuit may include a C/A Latch (i.e., a sampling latch). A data input end (i.e., a D input end) and a control input end (i.e., a CK input end) of the C/A Latch respectively receive the C/A Input signal (i.e., the to-be-sampled signal) and the CKT/CKB Input signal (i.e., the clock signal). When acquiring that the clock signal reaches a specific rising or falling edge, the C/A Latch triggers to latch the C/A Input signal, and save the level of the C/A Input signal at this time to the output C/A Output signal, thus completing the sampling of the to-be-sampled signal based on the clock signal.

It should be noted that, since the invalid signal in the C/A Input signal received by the C/A Latch has been shielded, when the C/A signal acquired by the input sampling circuit is an invalid signal, the sampling subcircuit does not perform sampling, that is, no data flipping occurs inside the C/A Latch. In this way, power consumption is saved.

Figure 7:
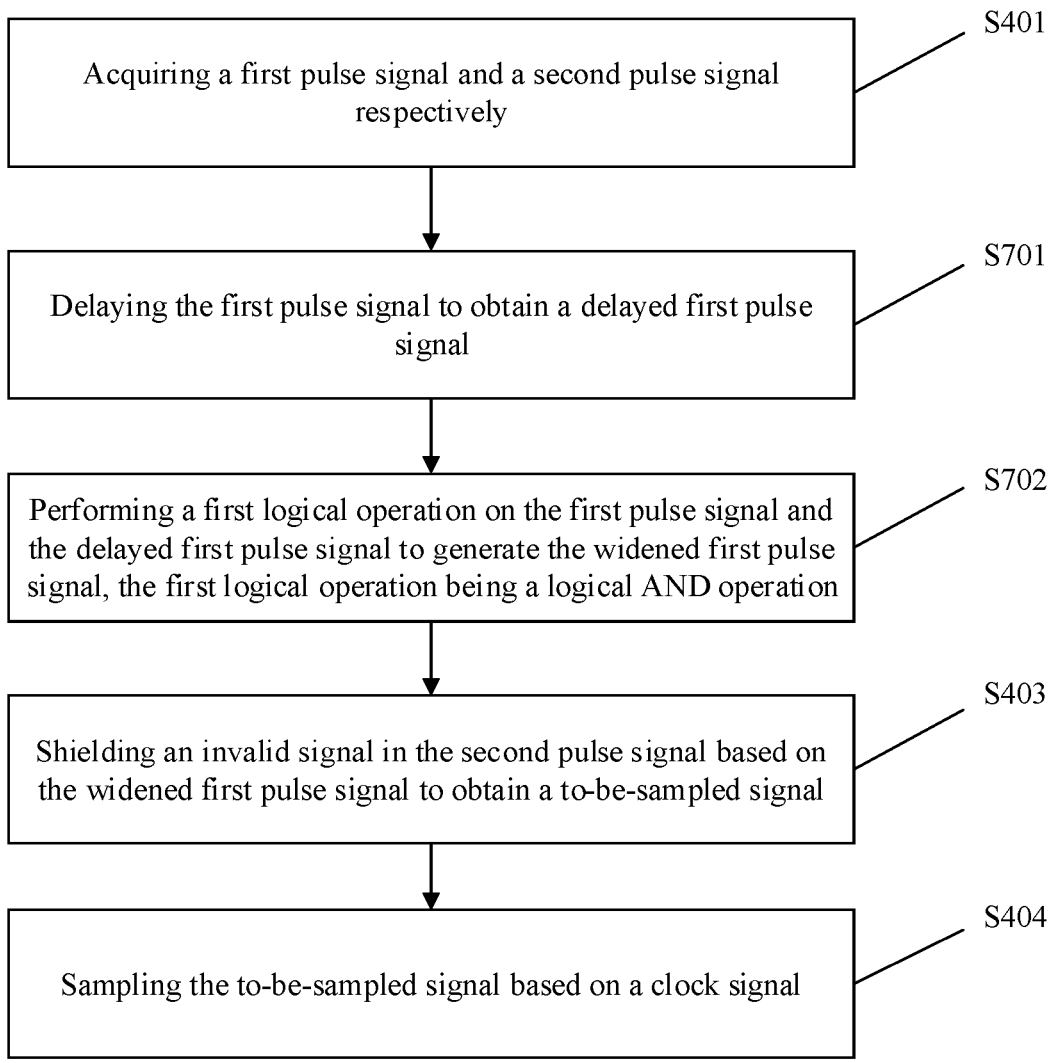
FIG. 7 is a flowchart II of an input sampling method provided by an embodiment of the present application.

In some embodiments of the present application, S402 illustrated in FIG. 4 can be implemented through S701 to S702 illustrated in FIG. 7, which may be described in combination with each operation.

At S701, the first pulse signal is delayed, to obtain a delayed first pulse signal.

In the embodiment of the present application, the widening subcircuit in the input sampling circuit includes a delay subcircuit. The delay subcircuit may delay the first pulse signal. The delay subcircuit may delay the pulse of the first pulse signal on a time axis to obtain and output the delayed first pulse signal.

At S702, a first logical operation is performed on the first pulse signal and the delayed first pulse signal to generate the widened first pulse signal. The first logical operation is a logical AND operation.

In the embodiment of the present application, the widening subcircuit in the input sampling circuit further includes a first logical subcircuit. The first logical subcircuit receives the first pulse signal and the delayed first pulse signal, and performs the first logical operation on these signals to generate the widened first pulse signal.

It should be noted that, the specific form of the first logical operation is related to the type of the first pulse signal. When the first pulse signal is an active low-level chip select signal, the first logical operation is a logical AND operation. However, if the first pulse signal is another type of signal, the first logical operation needs to be adjusted and changed accordingly, which is not limited here.

Figure 8:
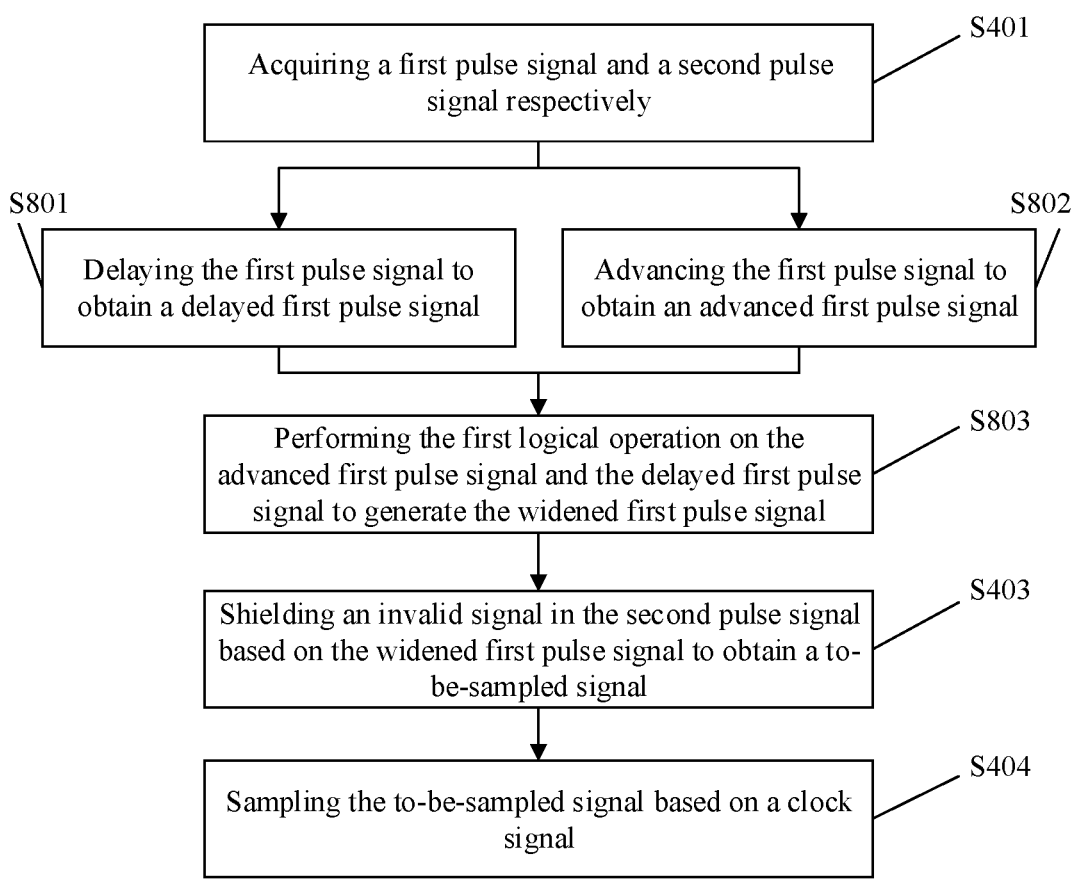
FIG. 8 is a flowchart III of an input sampling method provided by an embodiment of the present application.

In some embodiments of the present application, S402 illustrated in FIG. 4 can be implemented through S801 to S803 illustrated in FIG. 8, which may be described in combination with each operation.

At S801, the first pulse signal is delayed, to obtain a delayed first pulse signal.

In the embodiment of the present application, the widening subcircuit in the input sampling circuit includes a delay subcircuit. The delay subcircuit may delay the first pulse signal. The delay subcircuit may delay the pulse of the first pulse signal on a time axis to obtain and output the delayed first pulse signal.

At S802, the first pulse signal is advanced, to obtain an advanced first pulse signal.

In the embodiment of the present application, the input sampling circuit may advance the first pulse signal. The input sampling circuit may advance the pulse of the first pulse signal on the time axis to obtain and output the advanced first pulse signal.

At S803, the first logical operation is performed on the advanced first pulse signal and the delayed first pulse signal to generate the widened first pulse signal.

In the embodiment of the present application, the widening subcircuit in the input sampling circuit further includes a first logical subcircuit. The first logical subcircuit receives the advanced first pulse signal and the delayed first pulse signal, and performs the first logical operation on these signals to generate the widened first pulse signal.

It should be noted that, the specific form of the first logical operation is related to the type of the first pulse signal. When the first pulse signal is an active low-level chip select signal, the first logical operation is a logical AND operation. However, if the first pulse signal is another type of signal, the first logical operation needs to be adjusted and changed accordingly, which is not limited here.

In some embodiments of the present application, S802 illustrated in FIG. 8 can be implemented through S8021 to S8022, which may be described in combination with each operation.

At S8021, an absolute delay of a first receiver for receiving the first pulse signal is reduced, to obtain the advanced first pulse signal.

In the embodiment of the present application, the input sampling circuit can reduce the absolute delay of the first receiver for receiving the first pulse signal, to obtain the advanced first pulse signal.

It should be noted that, due to the internal structure, the first receiver has an absolute delay, and the absolute delay can be reduced by changing the internal structure thereof, so as to obtain the advanced first pulse signal.

At S8022, an upper-level processing subcircuit of the first receiver is triggered to send the first pulse signal to the first receiver in advance, to obtain the advanced first pulse signal.

In the embodiment of the present application, the input sampling circuit can trigger an upper-level processing subcircuit of the first receiver to send the first pulse signal to the first receiver in advance, to obtain the advanced first pulse signal.

It should be noted that, the first pulse signal is sent by the upper-level processing subcircuit, and the first pulse signal is sent in advance by adjusting the sending time of the upper-level processing subcircuit, so as to advance the first pulse signal.

Figure 9:
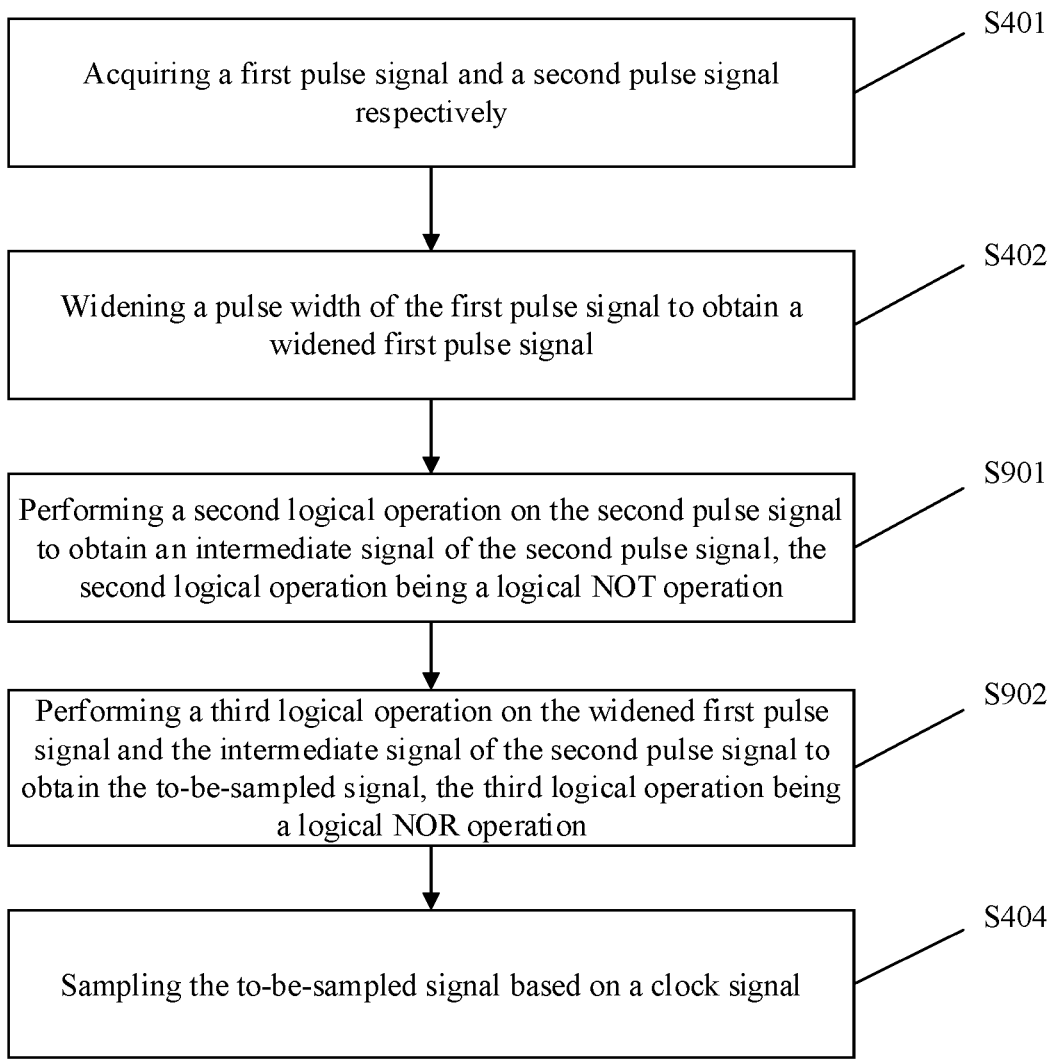
FIG. 9 is a flowchart IV of an input sampling method provided by an embodiment of the present application.

In some embodiments of the present application, S403 illustrated in FIG. 4 can be implemented through S901 to S902 illustrated in FIG. 9, which may be described in combination with each operation.

At S901, a second logical operation is performed on the second pulse signal to obtain an intermediate signal of the second pulse signal. The second logical operation is a logical NOT operation.

In the embodiment of the present application, the shielding subcircuit in the input sampling circuit further includes a second logical subcircuit. The second logical subcircuit can perform a second logical operation on the second pulse signal to obtain and output an intermediate signal of the second pulse signal.

At S902, a third logical operation is performed on the widened first pulse signal and the intermediate signal of the second pulse signal to obtain the to-be-sampled signal. The third logical operation is a logical NOR operation.

In the embodiment of the present application, the shielding subcircuit in the input sampling circuit further includes a third logical subcircuit. The third logical subcircuit can receive the first pulse signal and the intermediate signal of the second pulse signal, and then the third logical operation is performed on these signals to complete shielding of the invalid signal in the second pulse signal, to obtain a to-be-sampled signal.

It should be noted that, the specific forms of the second logical operation and the third logical operation are related to the types of the first pulse signal and the second pulse signal. When the first pulse signal and the second pulse signal are respectively an active low-level chip select signal and a C/A signal, the second logical operation is a logical NOT operation, and the third logical operation is a logical NOR operation. However, if the first pulse signal and the second pulse signal are other types of signals, the second logical operation and the third logical operation needs to be adjusted and changed accordingly, which is not limited here.

Figure 10:
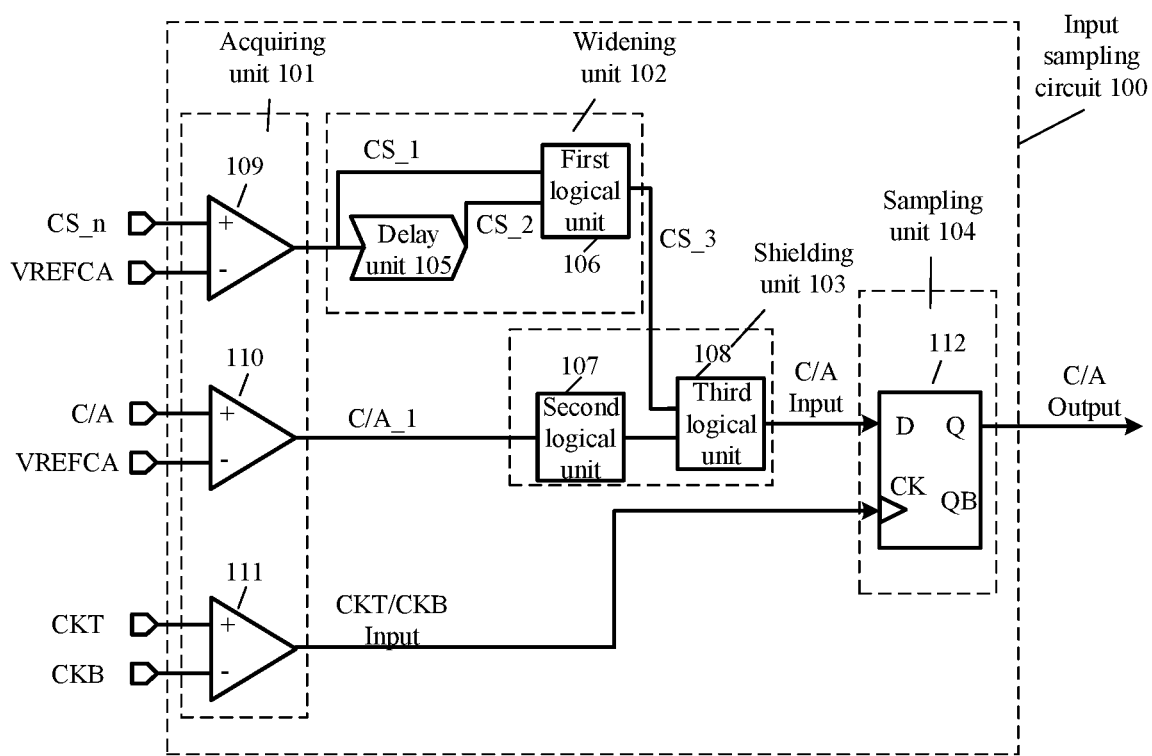
FIG. 10 is a schematic structural diagram II of an input sampling circuit provided by an embodiment of the present application.

Based on the foregoing input sampling method, the embodiments of the present application also provide an input sampling circuit. FIG. 10 is a schematic structural diagram of an input sampling circuit 100 provided by an embodiment of the present application. As illustrated in FIG. 10, the input sampling circuit 100 includes an acquiring subcircuit 101, a widening subcircuit 102, a shielding subcircuit 103, and a sampling subcircuit 104.

A first output end of the acquiring subcircuit 101 is connected to an input end of the widening subcircuit 102. A second output end of the acquiring subcircuit 101 and an output end of the widening subcircuit 102 are respectively connected to a first input end and a second input end of the shielding subcircuit 103. An output end of the shielding subcircuit 103 is connected to a data input end (i.e., a D input end) of the sampling subcircuit 104, and a clock signal is inputted to a control input end (i.e., a CK input end) of the sampling subcircuit 104.

The acquiring subcircuit 101 is configured to respectively acquire a first pulse signal and a second pulse signal. The widening subcircuit 102 is configured to widen a pulse width of the first pulse signal to obtain a widened first pulse signal. The shielding subcircuit 103 is configured to shield an invalid signal in the second pulse signal based on the widened first pulse signal to obtain a to-be-sampled signal. The sampling subcircuit 104 is configured to sample the to-be-sampled signal based on the clock signal.

In the embodiment of the present application, the acquiring subcircuit 101 may respectively obtain the first pulse signal and the second pulse signal. The first pulse signal is a chip select signal (i.e., a CS_n signal). The second pulse signal is a C/A signal. The chip select signal is active in a low-level state, and the C/A signal is controlled by the chip select signal.

Then the widening subcircuit 102 receives a first pulse signal (i.e., a CS_1 signal) outputted by the first output end of the acquiring subcircuit 101, and widens a pulse width of the first pulse signal, to obtain the widened first pulse signal (i.e., a CS_3 signal).

Then the shielding subcircuit 103 receives, through the first input end, the widened first pulse signal (i.e., the CS_3 signal) outputted by the widening subcircuit 102, then receives, through the second input end, the second pulse signal (i.e., the CA_1 signal) outputted by the second output end of the acquiring subcircuit 101, and shields the invalid signal in the second pulse signal based on the widened first pulse signal, to obtain a to-be-sampled signal (i.e., a CA_Input signal).

Finally, the sampling subcircuit 104 receives, through the data input end, the to-be-sampled signal (i.e., the CA_Input signal) outputted by the shielding subcircuit 103, and receives the clock signal (i.e., the CKT/CKB signal) through the control input end. Then, the sampling subcircuit 104 samples the to-be-sampled signal based on the clock signal, to obtain and output a sampled signal (i.e., a CA_Output signal).

In the input sampling circuit 100 according to the embodiment, the widening subcircuit 102 includes a delay subcircuit 105 and a first logical subcircuit 106. The first logical subcircuit 106 is an AND gate.

The first output end of the acquiring subcircuit 101 is connected to an input end of the delay subcircuit 105 and a first input end of the first logical subcircuit 106 respectively. An output end of the first logical subcircuit 106 and the second output end of the acquiring subcircuit 101 are respectively connected to the first input end and the second input end of the shielding subcircuit 103.

The delay subcircuit 105 is configured to delay the first pulse signal, to obtain a delayed first pulse signal. The first logical subcircuit 106 is configured to perform a first logical operation on the first pulse signal and the delayed first pulse signal to generate the widened first pulse signal. The first logical operation is a logical AND operation.

In the embodiment of the present application, the delay subcircuit 105 receives a first pulse signal (i.e., a CS_1 signal) outputted by the first output end of the acquiring subcircuit 101, and then delays the first pulse signal, to obtain the delayed first pulse signal (i.e., a CS_2 signal).

The first logical subcircuit 106 receives, through the first input end, a first pulse signal (i.e., a CS_1 signal) outputted by the first output end of the acquiring subcircuit 101, then receives, through the second input end, the delayed first pulse signal (i.e., a CS_2 signal) outputted by the delay subcircuit 105, and then perform the first logical operation on the first pulse signal and the delayed first pulse signal, to generate a widened first pulse signal (i.e., a CS_3 signal).

Figure 11:
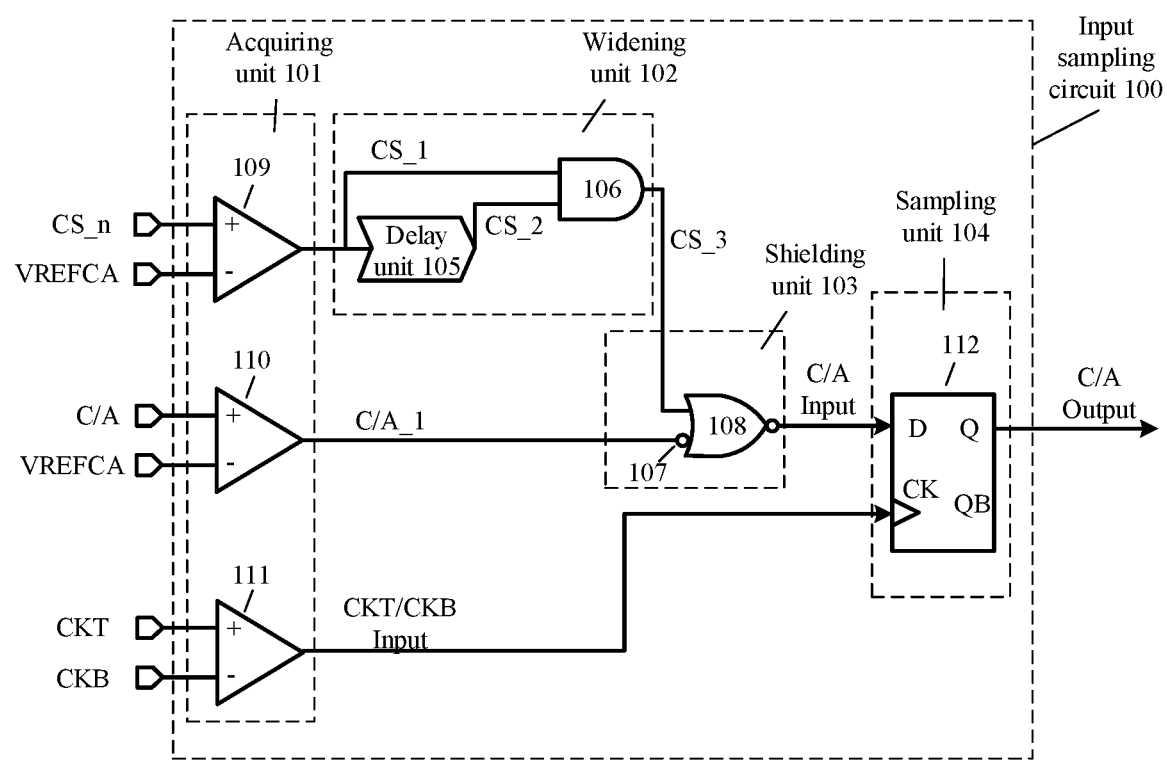
FIG. 11 is a schematic structural diagram III of an input sampling circuit provided by an embodiment of the present application.

It should be noted that, using which type of first logical subcircuit 106 is determined according to the type of the first pulse signal. When the first pulse signal is low-level valid, as illustrated in FIG. 11, the first logical subcircuit 106 is an AND gate, and the first logical operation is a logical AND operation. However, if the first pulse signal is another type of signal, the first logical subcircuit 106 needs to be adjusted and changed accordingly. For example, when the first pulse signal is high-level valid, the first logical subcircuit 106 needs to be adjusted to a logical OR operation accordingly, which is not limited here.

In the input sampling circuit 100 according to the embodiment, the shielding subcircuit 103 includes a second logical subcircuit 107 and a third logical subcircuit 108. The second logical subcircuit 107 is a NOT gate, and the third logical subcircuit 108 is a NOR gate.

An output end of the widening subcircuit 102 is connected to a first input end of the third logical subcircuit 108. The second output end of the acquiring subcircuit 101 is connected to an input end of the second logical subcircuit 107. An output end of the second logical subcircuit 107 is connected to a second input end of the third logical subcircuit 108. An output end of the third logical subcircuit 108 is connected to a data input end of the sampling subcircuit 104.

The second logical subcircuit 107 is configured to perform a second logical operation on the second pulse signal, to obtain an intermediate signal of the second pulse signal. The second logical operation may be a logical NOT operation. The third logical subcircuit 108 is configured to perform a third logical operation on the widened first pulse signal and the intermediate signal of the second pulse signal to obtain the to-be-sampled signal. The third logical operation may be a logical NOR operation.

In the embodiment of the present application, the second logical subcircuit 107 receives a second pulse signal (i.e., a CS_1 signal) outputted by the second output end of the acquiring subcircuit 101, and then performs a logical NOT operation on the second pulse signal, to obtain the intermediate signal of the second pulse signal.

The third logical subcircuit 108 receives, through the first input end, the widened first pulse signal (i.e., the CS_3 signal) outputted by the output end of the widening subcircuit 102, then receives, through the second input end, the intermediate signal outputted by the second logical subcircuit 107, and perform the logical NOR operation on the widened first pulse signal and the intermediate signal to obtain the to-be-sampled signal.

It should be noted that, using which type of second logical subcircuit 107 and third logical subcircuit 108 is determined according to the types of the first pulse signal and the second pulse signal. When the first pulse signal is active in a low-level state, as illustrated in FIG. 11, the second logical subcircuit 107 is a NOT gate, and the third logical subcircuit 108 is a NOR gate. Accordingly, the second logical operation is a logical NOT operation, and the third logical operation is a logical NOR operation. However, if the first pulse signal and the second pulse signal are other types of signals, the second logical subcircuit 107 and the third logical subcircuit 108 need to be adjusted and changed accordingly. For example, when the first pulse signal is active in a high-level state, the third logical subcircuit 108 needs to be adjusted to an AND gate accordingly, which is not limited here.

In the input sampling circuit 100 according to the embodiment, the acquiring subcircuit 101 includes a first receiver 109, a second receiver 110, and a third receiver 111.

The first receiver 109 is configured to acquire the first pulse signal. An output end of the first receiver 109 serves as the first output end of the acquiring subcircuit 101.

The second receiver 110 is configured to acquire the second pulse signal. An output end of the second receiver 110 serves as the second output end of the acquiring subcircuit 101.

The third receiver 111 is configured to acquire a clock signal, and inputs the clock signal to a control input end of the sampling subcircuit 104.

It should be noted that, the first receiver 109 has an absolute delay, and the absolute delay can be reduced by changing the internal structure thereof. Moreover, the advanced first pulse signal can be obtained by reducing the absolute delay of the first receiver 109, or triggering an upper-level processing subcircuit of the first receiver 109 to send the first pulse signal to the first receiver 109 in advance. Then, the advanced first pulse signal can be inputted to the widening subcircuit 102 as the CS_1 signal, and the widening subcircuit 102 can obtain the widened first pulse signal based on the advanced first pulse signal.

In the input sampling circuit 100 according to the embodiment, the sampling subcircuit 104 includes a sampling latch 112. The output end of the shielding subcircuit 103 is connected to the data input end (i.e., the D input end) of the sampling latch 112. The clock signal is inputted to a control input end (i.e., the CK input end) of the sampling latch.

In the embodiment of the present application, a data input end and a control input end of the sampling latch 112 respectively receive the C/A Input signal (i.e., the to-be-sampled signal) and the CKT/CKB Input signal (i.e., the clock signal). When acquiring that the clock signal reaches a specific rising or falling edge, the sampling latch 112 triggers to latch the C/A Input signal, and save the level of the C/A Input signal at this time to the output C/A Output signal, thus completing the sampling of the to-be-sampled signal based on the clock signal.

It should be noted that, the design of the input sampling circuit 100 provided by the embodiment of the present application is applied to a DRAM C/A input sampling system, which is not limited thereto. Both instruction collection in a high-frequency system and a low-power system can adopt the circuit design.

It can be understood that the design of the input sampling circuit 100 provided by the embodiment of the present application optimizes the original low power consumption design, so that the C/A input sampling system can maintain valid signal pulses with sufficient width even at high frequencies, thereby increasing the reliability of low power consumption design at high frequencies.

In some embodiments of the present application, the original CS_1 signal is pulled-in by reducing the absolute delay of the chip select signal receiver. Then the entire CS_1 pulse is postponed to the position of CS_2 through a delay subcircuit. Finally, a logical AND operation is performed on the CS_1 signal and the CS_2 signal through an AND gate to form a CS_3 chip select signal with a falling edge being pulled-in and a rising edge being pushed compared to the original CS_1.

Through the technical solution of the embodiment of the present application, the CS chip select signal is pulled-in, and then the rising edge is pushed for a period of delay. In this way, it can be ensured that even under the influence of PVT Variation, the pulse width of the chip select signal can still cover the C/A signal within the entire period. In this way, the output of the shielding subcircuit may not narrow the pulse width due to the skew between the chip select signal and the C/A signal, thereby ensuring the sufficient pulse width of the C/A signal at high frequencies, so that no risk of error occurs in the input sampling of next stage. While solving the technical problem of narrowing the pulse width, the embodiment of the present application still retains the function of the chip select signal to shield a C/A signal of a non-target DRAM, ensuring that the low power consumption design of the C/A input sampling system is still valid.

Figure 12:
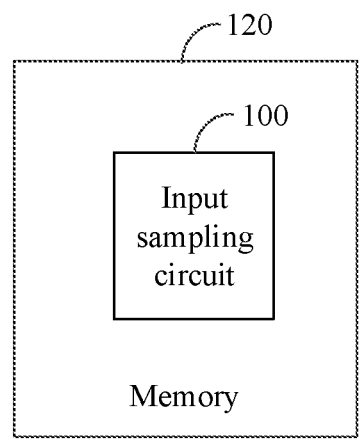
FIG. 12 is a schematic structural diagram of a memory according to an embodiment of the present application.

In yet another embodiment of the present application, FIG. 12 is a schematic structural diagram of a memory according to an embodiment of the present application. As illustrated in FIG. 12, the memory 120 includes at least the input sampling circuit 100 according to any one of the foregoing embodiments.

In the embodiment of the present application, the memory 120 can be integrated with an input sampling circuit 100. The input sampling circuit 100 can respectively obtain a first pulse signal and a second pulse signal, then widen a pulse width of the first pulse signal to obtain a widened first pulse signal, then shield an invalid signal in the second pulse signal based on the widened first pulse signal to obtain a to-be-sampled signal, and finally, sample the to-be-sampled signal based on a clock signal. In this way, prior to signal sampling, the invalid signal is shielded to avoid additional power consumption caused by sampling the invalid signal, and at the same time, the pulse width of the signal is widened to avoid sampling failure.

Figure 13:
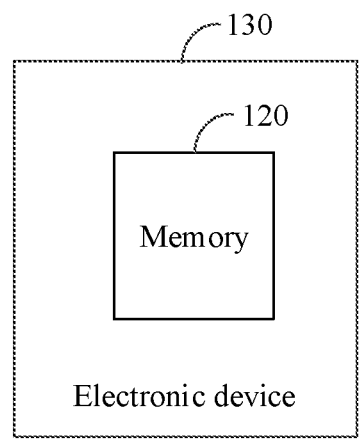
FIG. 13 is a schematic structural diagram of an electronic device according to an embodiment of the present application.

In still another embodiment of the present application, FIG. 13 is a schematic structural diagram of an electronic device 130 according to an embodiment of the present application. As illustrated in FIG. 13, the electronic device 130 includes at least the memory 120 according to the foregoing embodiment. By shielding the invalid signal and widening the signal pulse width, prior to signal sampling, the invalid signal is shielded to avoid additional power consumption caused by sampling the invalid signal, and at the same time, the pulse width of the signal is widened to avoid sampling failure.

It should be noted that, the terms "including", "comprising" or any other variants thereof in the present application are intended to cover non-exclusive inclusion, so that a process, method, article or apparatus including a series of elements not only includes those elements, but also includes other elements that are not explicitly listed, or elements inherent to the process, method, article or apparatus. Without more restrictions, the element defined by the sentence "including a . . . " does not exclude the existence of other identical elements in the process, method, article or apparatus including the element.

The serial numbers of the embodiments of the present application are only for the purpose of description but do not represent the merits of the embodiments. The methods disclosed in the method embodiments provided in the present application can be combined arbitrarily without conflict to obtain new method embodiments. The features disclosed in the product embodiments provided in the present application can be combined arbitrarily without conflict to obtain new product embodiments. The features disclosed in the method or device embodiments provided in the present application can be combined arbitrarily without conflict to obtain new method or device embodiments.

The descriptions above are only implementations of the present application. However, the scope of protection of the present application is not limited thereto. Within the technical scope disclosed by the present application, any variation or substitution that can be easily conceived of by those skilled in the art should all fall within the scope of protection of the present application. Therefore, the scope of protection of the present application should be determined by the scope of protection of the appended claims.

INDUSTRIAL APPLICABILITY

The embodiments of the present application provide an input sampling method and circuit, a memory and an electronic device, capable of respectively acquiring a first pulse signal and a second pulse signal, then widening a pulse width of the first pulse signal to obtain a widened first pulse signal, then shielding an invalid signal in the second pulse signal based on the widened first pulse signal to obtain a to-be-sampled signal, and finally, sampling the to-be-sampled signal based on a clock signal. In this way, prior to signal sampling, the invalid signal is shielded to avoid additional power consumption caused by sampling the invalid signal, and at the same time, the pulse width of the signal is widened to avoid sampling failure.

What is claimed is:
1. An input sampling method, comprising:
acquiring a first pulse signal and a second pulse signal respectively;
widening a pulse width of the first pulse signal to obtain a widened first pulse signal;
shielding an invalid signal in the second pulse signal based on the widened first pulse signal to obtain a to-be-sampled signal; and
sampling the to-be-sampled signal based on a clock signal;
wherein widening the pulse width of the first pulse signal to obtain the widened first pulse signal comprises:

delaying the first pulse signal to obtain a delayed first pulse signal; and
performing a first logical operation on the first pulse signal and the delayed first pulse signal to generate the widened first pulse signal, the first logical operation being a logical AND operation.

2. The input sampling method of claim 1, wherein widening the first pulse signal to obtain the widened first pulse signal further comprises:
advancing the first pulse signal to obtain an advanced first pulse signal; and
performing the first logical operation on the advanced first pulse signal and the delayed first pulse signal to generate the widened first pulse signal.

3. The input sampling method of claim 2, wherein advancing the first pulse signal to obtain the advanced first pulse signal comprises:
reducing an absolute delay of a first receiver for receiving the first pulse signal, to obtain the advanced first pulse signal; or
triggering an upper-level processing subcircuit of the first receiver to send the first pulse signal to the first receiver in advance, to obtain the advanced first pulse signal.

4. The input sampling method of claim 1, wherein shielding the invalid signal in the second pulse signal based on the widened first pulse signal to obtain the to-be-sampled signal comprises:
performing a second logical operation on the second pulse signal to obtain an intermediate signal of the second pulse signal, the second logical operation being a logical NOT operation; and
performing a third logical operation on the widened first pulse signal and the intermediate signal of the second pulse signal to obtain the to-be-sampled signal, the third logical operation being a logical NOR operation.

5. The input sampling method of claim 1, wherein
the first pulse signal is a chip select signal; and
the second pulse signal is a control signal or an address signal.

6. An input sampling circuit, comprising an acquiring subcircuit, a widening subcircuit, a shielding subcircuit, and a sampling subcircuit;
a first output end of the acquiring subcircuit being connected to an input end of the widening subcircuit;
a second output end of the acquiring subcircuit and an output end of the widening subcircuit being respectively connected to a first input end and a second input end of the shielding subcircuit;
an output end of the shielding subcircuit being connected to a data input end of the sampling subcircuit; and
a clock signal being inputted to a control input end of the sampling subcircuit; wherein
the acquiring subcircuit is configured to respectively acquire a first pulse signal and a second pulse signal;
the widening subcircuit is configured to widen a pulse width of the first pulse signal to obtain a widened first pulse signal;
the shielding subcircuit is configured to shield an invalid signal in the second pulse signal based on the widened first pulse signal to obtain a to-be-sampled signal; and
the sampling subcircuit is configured to sample the to-be-sampled signal based on the clock signal.

7. The input sampling circuit according to claim 6, wherein the widening subcircuit comprises a delay subcircuit and a first logical subcircuit, and the first logical subcircuit is an AND gate;
the first output end of the acquiring subcircuit being connected to the input end of the widening subcircuit comprises: a first output end of the acquiring subcircuit being connected to an input end of the delay subcircuit and a first input end of the first logical subcircuit respectively;
the output end of the widening subcircuit and the second output end of the acquiring subcircuit being respectively connected to the first input end and the second input end of the shielding subcircuit comprises: an output end of the first logical subcircuit and a second output end of the acquiring subcircuit being respectively connected to a first input end and a second input end of the shielding subcircuit; wherein
the delay subcircuit is configured to delay the first pulse signal to obtain a delayed first pulse signal; and
the first logical subcircuit is configured to perform a first logical operation on the first pulse signal and the delayed first pulse signal to generate the widened first pulse signal, the first logical operation being a logical AND operation.

8. The input sampling circuit according to claim 6, wherein the shielding subcircuit comprises a second logical subcircuit and a third logical subcircuit, the second logical subcircuit is a NOT gate, and the third logical subcircuit is a NOR gate;
the output end of the widening subcircuit and the second output end of the acquiring subcircuit being respectively connected to the first input end and the second input end of the shielding subcircuit further comprises: an output end of the widening subcircuit being connected to a first input end of the third logical subcircuit, the second output end of the acquiring subcircuit is connected to an input end of the second logical subcircuit, and an output end of the second logical subcircuit is connected to a second input end of the third logical subcircuit;
the output end of the shielding subcircuit being connected to a data input end of the sampling subcircuit comprises: an output end of the third logical subcircuit being connected to a data input end of the sampling subcircuit; wherein
the second logical subcircuit is configured to perform a second logical operation on the second pulse signal to obtain an intermediate signal of the second pulse signal, the second logical operation being a logical NOT operation; and
the third logical subcircuit is configured to perform a third logical operation on the widened first pulse signal and the intermediate signal of the second pulse signal to obtain the to-be-sampled signal, the third logical operation being a logical NOR operation.

9. The input sampling circuit of claim 6, wherein the acquiring subcircuit comprises:
a first receiver, configured to obtain the first pulse signal, an output end of the first receiver serving as the first output end of the acquiring subcircuit; and
a second receiver, configured to obtain the second pulse signal, an output end of the second receiver serving as the second output end of the acquiring subcircuit.

10. The input sampling circuit of claim 6, wherein the sampling subcircuit comprises a sampling latch;
the output end of the shielding subcircuit being connected to a data input end of the sampling subcircuit comprises: an output end of the shielding subcircuit being connected to a data input end of the sampling latch;

the clock signal being inputted to a control input end of the sampling subcircuit comprises: the clock signal being inputted to a control input end of the sampling latch.

11. The input sampling circuit of claim 6, wherein
the first pulse signal is a chip select signal; and
the second pulse signal is a control signal or an address signal.

12. A memory, comprising at least an input sampling circuit, the input sampling circuit including an acquiring subcircuit, a widening subcircuit, a shielding subcircuit, and a sampling subcircuit; a first output end of the acquiring subcircuit being connected to an input end of the widening subcircuit;
a second output end of the acquiring subcircuit and an output end of the widening subcircuit being respectively connected to a first input end and a second input end of the shielding subcircuit;
an output end of the shielding subcircuit being connected to a data input end of the sampling subcircuit; and
a clock signal being inputted to a control input end of the sampling subcircuit; wherein
the acquiring subcircuit is configured to respectively acquire a first pulse signal and a second pulse signal;
the widening subcircuit is configured to widen a pulse width of the first pulse signal to obtain a widened first pulse signal;
the shielding subcircuit is configured to shield an invalid signal in the second pulse signal based on the widened first pulse signal to obtain a to-be-sampled signal; and
the sampling subcircuit is configured to sample the to-be-sampled signal based on the clock signal.

13. The memory according to claim 12, wherein the widening subcircuit comprises a delay subcircuit and a first logical subcircuit, and the first logical subcircuit is an AND gate;
the first output end of the acquiring subcircuit being connected to the input end of the widening subcircuit comprises: a first output end of the acquiring subcircuit being connected to an input end of the delay subcircuit and a first input end of the first logical subcircuit respectively;
the output end of the widening subcircuit and the second output end of the acquiring subcircuit being respectively connected to the first input end and the second input end of the shielding subcircuit comprises: an output end of the first logical subcircuit and a second output end of the acquiring subcircuit being respectively connected to a first input end and a second input end of the shielding subcircuit; wherein
the delay subcircuit is configured to delay the first pulse signal to obtain a delayed first pulse signal; and
the first logical subcircuit is configured to perform a first logical operation on the first pulse signal and the delayed first pulse signal to generate the widened first pulse signal, the first logical operation being a logical AND operation.

14. The memory according to claim 12, wherein the shielding subcircuit comprises a second logical subcircuit and a third logical subcircuit, the second logical subcircuit is a NOT gate, and the third logical subcircuit is a NOR gate;
the output end of the widening subcircuit and the second output end of the acquiring subcircuit being respectively connected to the first input end and the second input end of the shielding subcircuit further comprises: an output end of the widening subcircuit being connected to a first input end of the third logical subcircuit, the second output end of the acquiring subcircuit is connected to an input end of the second logical subcircuit, and an output end of the second logical subcircuit is connected to a second input end of the third logical subcircuit;
the output end of the shielding subcircuit being connected to a data input end of the sampling subcircuit comprises: an output end of the third logical subcircuit being connected to a data input end of the sampling subcircuit; wherein
the second logical subcircuit is configured to perform a second logical operation on the second pulse signal to obtain an intermediate signal of the second pulse signal, the second logical operation being a logical NOT operation; and
the third logical subcircuit is configured to perform a third logical operation on the widened first pulse signal and the intermediate signal of the second pulse signal to obtain the to-be-sampled signal, the third logical operation being a logical NOR operation.

15. The memory of claim 12, wherein the acquiring subcircuit comprises:
a first receiver, configured to obtain the first pulse signal, an output end of the first receiver serving as the first output end of the acquiring subcircuit; and
a second receiver, configured to obtain the second pulse signal, an output end of the second receiver serving as the second output end of the acquiring subcircuit.

16. The memory of claim 12, wherein the sampling subcircuit comprises a sampling latch;
the output end of the shielding subcircuit being connected to a data input end of the sampling subcircuit comprises: an output end of the shielding subcircuit being connected to a data input end of the sampling latch;
the clock signal being inputted to a control input end of the sampling subcircuit comprises: the clock signal being inputted to a control input end of the sampling latch.

17. The memory of claim 12, wherein
the first pulse signal is a chip select signal; and
the second pulse signal is a control signal or an address signal.

18. An electronic device, comprising at least the memory of claim 12.

* * * * *